United States Patent
Early

(10) Patent No.: US 7,569,449 B1
(45) Date of Patent: Aug. 4, 2009

(54) PROCESSES PROVIDING HIGH AND LOW THRESHOLD P-TYPE AND N-TYPE TRANSISTORS

(75) Inventor: Adrian B. Early, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 35 days.

(21) Appl. No.: 11/543,580

(22) Filed: Oct. 3, 2006

Related U.S. Application Data

(62) Division of application No. 10/306,414, filed on Nov. 27, 2002, now Pat. No. 7,115,462.

(60) Provisional application No. 60/334,153, filed on Nov. 28, 2001.

(51) Int. Cl.
H01L 21/8238 (2006.01)

(52) U.S. Cl. .................. 438/217; 438/197; 438/289; 257/E21.05; 257/E21.315; 257/E21.633

(58) Field of Classification Search ................ 438/197, 438/199, 217, 276, 289, 301, 305, 306, 307, 438/510
See application file for complete search history.

(56) References Cited

U.S. PATENT DOCUMENTS

| | | | |
|---|---|---|---|
| 3,783,052 A | 1/1974 | Fisher | |
| 5,291,052 A | 3/1994 | Kim et al. | |
| 5,311,078 A | 5/1994 | Makino | |
| 5,407,849 A | 4/1995 | Khambaty et al. | |
| 5,493,251 A | 2/1996 | Khambaty et al. | |
| 5,668,487 A | 9/1997 | Chonan | |
| 5,723,357 A | 3/1998 | Huang | |
| 5,821,778 A | 10/1998 | Bosshart | |
| 5,854,494 A * | 12/1998 | Yamazaki et al. | 257/57 |
| 5,863,831 A | 1/1999 | Ling et al. | |
| 5,989,949 A | 11/1999 | Kim et al. | |
| 6,028,333 A * | 2/2000 | Yamazaki et al. | 257/296 |
| 6,372,590 B1 | 4/2002 | Nayak et al. | |
| 6,953,713 B2 * | 10/2005 | Yamazaki et al. | 438/129 |
| 7,115,462 B1 * | 10/2006 | Early | 438/217 |

OTHER PUBLICATIONS

USPTO Notice of Allowance for U.S. Appl. No. 11/543,580, dated Nov. 18, 2008.
USPTO Notice of Allowance for U.S. Appl. No. 10/306,414, dated May 12, 2006.
USPTO Final Rejection for U.S. Appl. No. 10/306,414, dated Feb. 8, 2006.
USPTO Non-Final Rejection for U.S. Appl. No. 10/306,414, dated Aug. 23, 2005.
USPTO Advisory Action for U.S. Appl. No. 10/306,414, dated May 5, 2005.
USPTO Final Rejection for U.S. Appl. No. 10/306,414, dated Feb. 8, 2005.
USPTO Non-Final Rejection for U.S. Appl. No. 10/306,414, dated Mar. 26, 2004.

* cited by examiner

Primary Examiner—David Nhu

(57) ABSTRACT

Methods of fabricating negative-channel metal-oxide semiconductor (NMOS) devices and positive-channel metal-oxide semiconductor (PMOS) devices having complementary threshold voltages are described. Elements of lower-threshold voltage NMOS devices are formed at first locations on a substrate. Elements of higher-threshold voltage PMOS devices are formed at second locations on the substrate. Elements of higher-threshold voltage NMOS devices and elements of lower-threshold PMOS devices are formed by adding a same amount of p-type dopant at selected locations chosen from the first and second locations.

12 Claims, 7 Drawing Sheets

PROCESSES PROVIDING HIGH AND LOW THRESHOLD P-TYPE AND N-TYPE TRANSISTORS

RELATED U.S. PATENT APPLICATION

This Divisional Application claims the benefit of the commonly-owned U.S. patent application Ser. No. 10/306,414, filed on Nov. 27, 2002, which is now issued as a U.S. Pat. No. 7,115,462 B1. by Early, and titled "Processes Providing High And Low Threshold P-Type And N-Type Transistors," which is incorporated herein by reference, which claims priority to the provisional patent application Ser. No. 60/334,153, entitled "Process Providing Normal and Low Threshold NMOS and PMOS Transistors (Method of Making High Threshold Voltage N-Channel (and P-Channel) Transistors)," with filing date Nov. 28, 2001, assigned to the assignee of the present application, and hereby incorporated by reference in its entirety.

TECHNICAL FIELD

Embodiments of the present invention relate to semiconductor devices such as transistors. More specifically, embodiments of the present invention relate to methods for forming transistors.

BACKGROUND

Various techniques known in the art can be used to fabricate a semiconductor device such as a transistor. In general, these techniques involve repeating, with variations, a number of characteristic steps or processes. One of these characteristic steps or processes involves applying a layer of material to an underlying substrate or to a preceding layer, and then selectively removing the material using, for example, an etch process. Another of the characteristic steps or processes involves adding dopant materials (e.g., an ion implant) to the substrate or to one or more of the subsequent layers. Using these characteristic processes, a transistor, generally comprising different types of material, can be accurately formed.

One characteristic of a transistor is its threshold voltage," generally defined as the input voltage at which the output logic level of the transistor changes state. Another definition of the term "threshold voltage" is the gate voltage above which the transistor becomes conductive. The operational speed of a transistor is a function of its threshold voltage. To increase speed, the threshold voltage is decreased. However, there is a tradeoff; with decreased threshold voltage, the drive current and leakage current of the transistors are increased, increasing power consumption. Thus, depending for instance on the planned application of the transistor, a manufacturer will select a particular threshold voltage for the transistor, based on factors including speed and power consumption.

Types of transistors known in the art include those commonly referred to as NMOS (negative-channel metal-oxide semiconductor) devices and PMOS (positive-channel metal-oxide semiconductor) devices. The threshold voltage of these types of devices is dependent on the original doping concentration of the silicon substrate used as the foundation for forming the transistor. For PMOS devices, the threshold voltage can be reduced by adjusting the original doping concentration using another, subsequent implantation of dopant into the substrate. This latter implantation may be generally referred to as the "threshold adjust." Typically, the threshold adjust uses boron ions (or ions that include boron, such as $BF_2$ ions) as the dopant, in which case the threshold adjust may be referred to as the "boron adjust." By adding dopant, particularly a p-type dopant that includes boron, the threshold voltage of a PMOS device is lowered.

As mentioned above, NMOS devices having a particular threshold voltage can be fashioned by specifying the appropriate original doping concentration. However, according to the conventional art, a threshold adjust process for reducing the threshold voltage of NMOS devices is lacking.

One conventional approach that provides higher-threshold voltage and lower-threshold voltage NMOS devices involves using a first set of masks to create one type of devices (e.g., higher-threshold voltage devices) and a second set of masks to create the other type of devices (e.g., lower-threshold voltage devices). Using this approach, the substrate is masked and the exposed areas of the substrate are implanted with dopant at a concentration that establishes, for instance, a higher-threshold voltage for the NMOS devices. A different mask is subsequently used to cover the implanted regions and expose new regions of the substrate to implantation. These regions of the substrate are implanted with dopant at a concentration that establishes a lower-threshold voltage for the NMOS devices. These steps can be repeated to form higher-threshold voltage and lower-threshold voltage PMOS devices.

A disadvantage to this approach is its inefficiency. According to the approach just described, four masking steps and four implant steps are used to form higher-threshold voltage and lower-threshold voltage NMOS and PMOS devices.

Therefore, a method for fabricating NMOS devices, as well as PMOS devices, that is more efficient than the conventional art would be an improvement. The present invention provides such an improvement.

SUMMARY OF THE INVENTION

Embodiments of the present invention pertain to methods of fabricating negative-channel metal-oxide semiconductor (NMOS) devices as well as positive-channel metal-oxide semiconductor (PMOS) devices that have different threshold voltages. In one embodiment, elements of lower-threshold voltage NMOS devices are formed at first locations on a substrate. Elements of higher-threshold voltage PMOS devices are formed at second locations on the substrate. Elements of higher-threshold voltage NMOS devices and elements of lower-threshold PMOS devices are formed by adding a same amount of p-type dopant to the elements of the lower-threshold voltage NMOS devices and to the elements of the higher-threshold voltage PMOS devices at selected locations chosen from the first and second locations.

In another embodiment, n-type dopant is implanted at first locations in a substrate to form source and drain regions for the NMOS devices. The first locations are doped with p-type dopant to a first concentration that corresponds specifically to a first threshold voltage. An amount of p-type dopant is added to the first concentration at second locations selected from the first locations. The addition of this amount to the first concentration provides a second concentration that corresponds specifically to a second threshold voltage that is higher than the first threshold voltage. The NMOS devices formed at the first locations (corresponding to the first concentration) will have the first threshold voltage, while NMOS devices formed at the second locations (corresponding to the second concentration) will have the second threshold voltage.

In yet another embodiment, n-doped regions are formed in a p-type substrate at first locations where NMOS devices will be formed. The n-doped regions correspond to source and drain regions for the NMOS devices. A set of n-wells is formed in the p-type substrate at second locations where PMOS devices will be formed. P-doped regions are formed within the n-wells. The p-doped regions correspond to source and drain regions for the PMOS devices. A same amount of p-type dopant is added at selected locations chosen from the first and the second locations. The dopant concentrations of p-type dopant at the first and second locations and the dopant concentrations at the selected locations correspond to specific threshold voltages for the NMOS and PMOS devices.

In its various embodiments, the present invention can reduce the number of masking steps and implant steps relative to conventional approaches. These and other objects and advantages of the various embodiments of the present invention will become recognized by those of ordinary skill in the art after having read the following detailed description of the embodiments that are illustrated in the various drawing figures.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION OF THE INVENTION

Figure 1A:
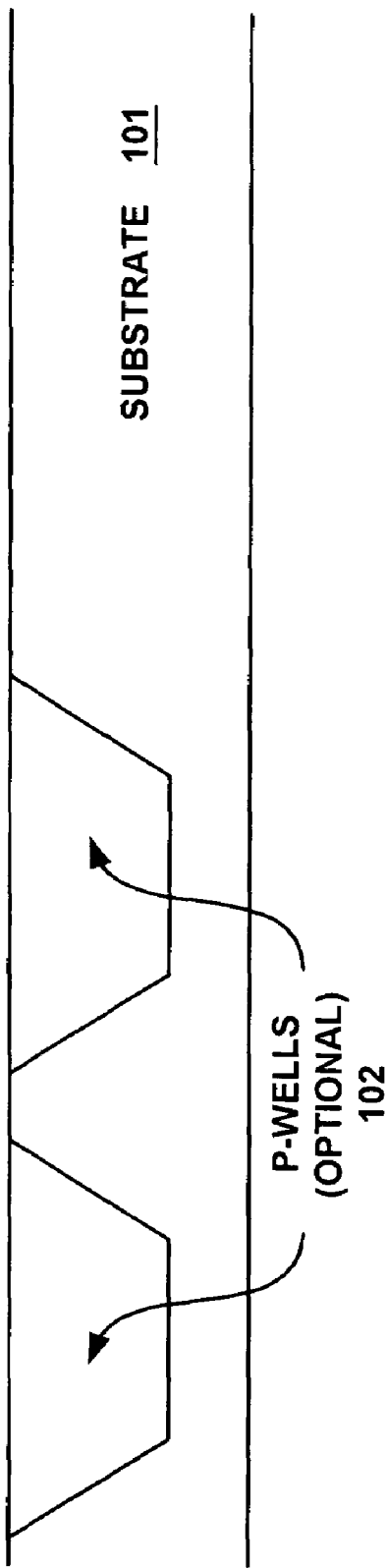
FIGS. 1 A, 1 B, 1 C and 1 D illustrate various stages of a process for fabricating NMOS and PMOS devices according to one embodiment of the present invention.

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "forming," "implanting," "adding," "receiving" or the like, refer to actions and processes (e.g., flowcharts 200, 300 and 400 of FIGS. 2, 3 and 4, respectively) of semiconductor device fabrication.

FIGS. 1A, 1B, 1C and 1D illustrate various stages of a process for fabricating negative-channel metal-oxide semiconductor (NMOS) devices and positive-channel metal-oxide semiconductor (PMOS) devices according to one embodiment of the present invention. It is understood that FIGS. 1A through 1D are not drawn to scale and that only portions of the substrate 101 are shown. For simplicity of discussion and illustration, the process is described for four transistors, although in actuality many more transistors may be formed.

Furthermore, although the devices being formed are referred to as transistors, it is appreciated that FIGS. 1A through 1D only show a transistor in the process of being formed, and not necessarily a completely formed transistor. It is appreciated that other processes and steps associated with the fabrication of transistors may be performed along with the process illustrated by FIGS. 1A through 1D; that is, there may be a number of process steps before, after and in between the steps shown and described by FIGS. 1A through 1D. For example, masking steps are not illustrated. Importantly, embodiments of the present invention can be implemented in conjunction with these other (conventional) processes and steps without significantly perturbing them.

FIG. 1A shows a substrate 101 in which, according to one embodiment, p-wells 102 have been formed. The locations of the p-wells 102 correspond to locations at which NMOS devices will be formed. As will be seen by the following discussion, the p-wells 102 are optional. In one embodiment, the dopant concentration of p-wells 102 is approximately $1.8 \times 10^{17}$ per cubic centimeter (cc).

In the present embodiment, the substrate 101 is doped with a p-type dopant to some native or background concentration. In one such embodiment, the native or background concentration in substrate 101 (hereinafter, simply the "background concentration") corresponds to a specific threshold voltage for at least some of the NMOS devices and PMOS devices that will be formed using the substrate 101. In another such embodiment, the background concentration corresponds to a specific threshold voltage for at least some of the PMOS devices that will be formed using substrate 101; however, the background concentration is less than the concentration that would correspond to the threshold voltage desired for at least some of the NMOS devices that will be formed using substrate 101. In this latter embodiment, the optional p-wells 102 can be used to elevate the p-type dopant to the concentration that corresponds to a specific threshold voltage for at least some of the NMOS devices that will be formed.

The terminology "at least some" is used in the above discussion because, as will be seen, at selected locations a "threshold adjust" will be performed to alter the threshold voltage of some of the NMOS devices and/or some of the PMOS devices. Thus, according to the embodiments of the present invention, some NMOS devices can have one threshold voltage and other NMOS devices another threshold voltage, and similarly some of the PMOS devices can have one threshold voltage and other PMOS devices another threshold voltage, all on the same substrate 101. Importantly, as will be described, this is achieved using a single threshold adjust. It is appreciated that the optional p-wells 102 may be formed at some locations at which NMOS devices will be formed, but not at other such locations, thereby providing further flexibility in the range of threshold voltages.

To summarize to this point, in an embodiment in which the optional p-wells 102 are not formed, the locations corresponding to the NMOS devices and the locations corresponding to the PMOS devices have substantially equal concentrations of p-type dopant (the background concentration of substrate 101). In an embodiment in which the optional p-wells 102 are formed, the locations corresponding to the NMOS devices will have a higher concentration of p-type dopant than the locations corresponding to the PMOS devices; the difference in concentration corresponds to the amount of dopant added (implanted or diffused) to form the p-wells 102. In each of these embodiments, the concentration of p-type dopant at each location corresponds to a specific threshold voltage. Typically, the concentration at each location corresponds to a lower-threshold voltage or a higher-threshold voltage. Note that the terms "lower-threshold voltage" and "higher-threshold voltage" are used to describe the relative values of one transistor's threshold voltage to the threshold voltage of another transistor. In one embodiment, the lower-threshold voltage is in the range of 0.4-0.5 volts, and the higher-threshold voltage is approximately one (1) volt; however, other embodiments of the present invention are not so limited.

Figure 1B:
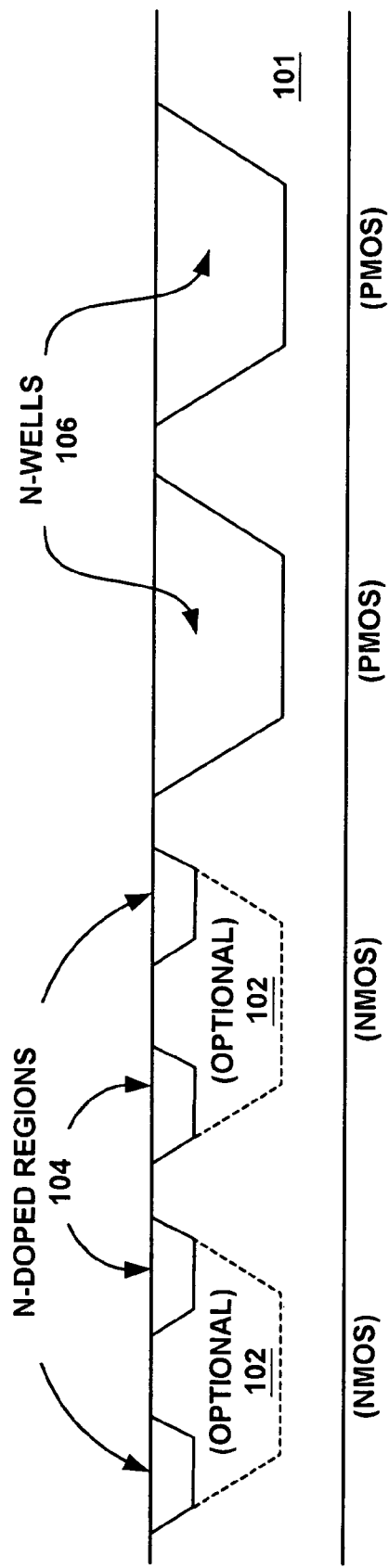

FIG. 1B shows substrate 101 in which, according to the present embodiment of the present invention, n-doped regions 104 and n-wells 106 have been formed. The n-doped regions 104 are formed at locations ("first locations") at which NMOS devices will be formed. The n-wells 106 are formed at locations ("second locations") at which PMOS devices will be formed. In one embodiment, the n-doped regions 104 are formed within the optional p-wells 102; in an alternative embodiment, the n-doped regions 104 are formed within the substrate 101. The n-doped regions 104 correspond to the source and drain regions of the NMOS devices to be formed. In one embodiment, the dopant concentration of n-wells 106 is approximately $3 \times 10^{17}$ per cc.

Figure 1C:
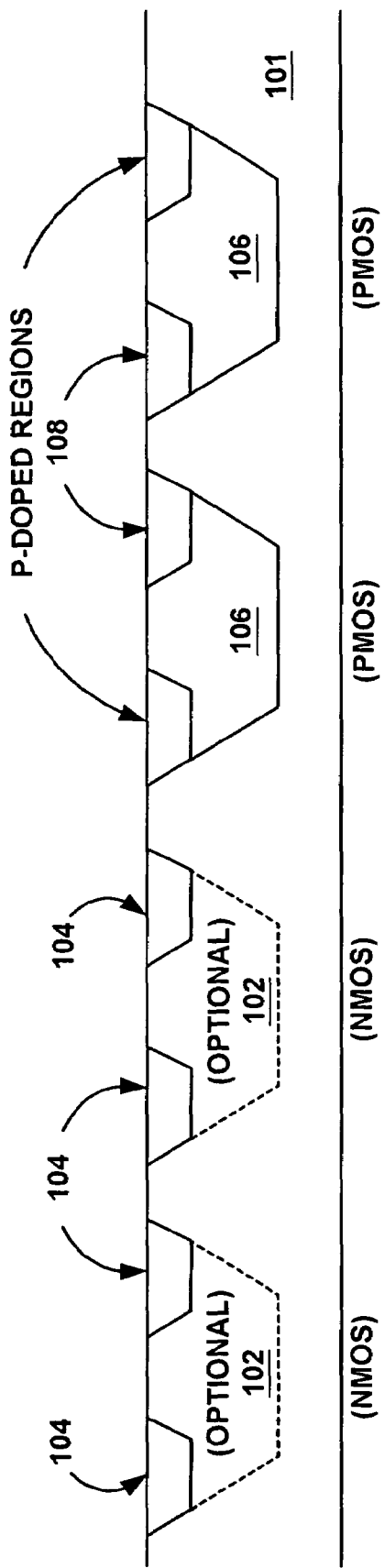

FIG. 1C shows substrate 101 in which, according to the present embodiment of the present invention, p-doped regions 108 have been formed in the n-wells 106 (that is, at the locations at which PMOS devices will be formed). The p-doped regions 108 correspond to the source and drain regions of the PMOS devices to be formed.

Figure 1D:
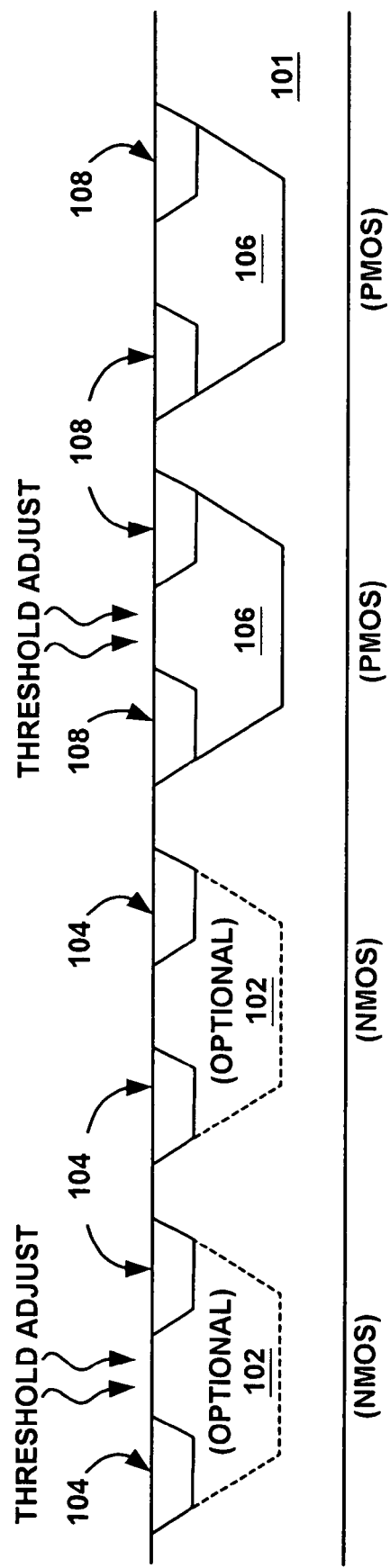

FIG. 1D illustrates a threshold voltage adjustment (threshold adjust) performed according to one embodiment of the present invention. More specifically, an amount of dopant is implanted (added or diffused) into substrate 101 at selected locations. Significantly, according to embodiments of the present invention, the amount of dopant implanted for the threshold adjust is the same (or substantially the same) at each of these selected locations. Also of significance, the threshold adjust is accomplished in a single process step. That is, each location selected to receive the threshold adjust can receive the implant in the same process step. As a consequence, only a single mask step may be used to mask off the locations that are not to receive the threshold adjust implant, leaving exposed only those locations that are to receive the threshold adjust implant.

In one embodiment, the dopant used for the threshold adjust includes a p-type dopant. P-type dopants used for the threshold adjust generally include boron ions, or ions formed of compounds of boron and other elements such as fluorine.

The addition of p-type dopant in a location at which an NMOS device will be formed will increase the threshold voltage for that NMOS device. Thus, the threshold adjust implant will create higher-threshold voltage NMOS devices (e.g., a threshold voltage of approximately 1 volt), while NMOS devices at locations that do not receive the threshold adjust implant will remain lower-threshold voltage NMOS devices (e.g., a threshold voltage in the range of approximately 0.4-0.5 volts).

The addition of p-type dopant at a location at which a PMOS device will be formed will decrease the threshold voltage for that PMOS device. Thus, the threshold adjust implant will create lower-threshold voltage PMOS devices (e.g., a threshold voltage in the range of approximately 0.4-0.5 volts), while PMOS devices at locations that do not receive the threshold adjust implant will remain higher-threshold voltage PMOS devices (e.g., a threshold voltage of approximately 1 volt).

Looking at FIGS. 1A through 1D in review, and focusing on those steps in the process related to the establishment of threshold voltage (that is, excluding the steps that are used to form source and drain regions, for example), the number of mask steps and implant steps can be reduced relative to the conventional art. In one embodiment, in which the optional p-wells 102 are not formed, the concentration of p-type dopant in the substrate 101 corresponds to a specific threshold value, e.g., the higher-threshold value for PMOS devices and the lower-threshold value for NMOS devices. A single mask can be used to define which locations (which PMOS and NMOS devices) are to receive the threshold adjust implant. Because other process steps for forming transistors are unaffected, the overall number of process steps can be reduced according to the embodiments of the present invention.

From another perspective, the embodiments of the present invention permit the formation of NMOS and PMOS transistors having different threshold voltages without the addition of new process steps. The threshold adjust implant conventionally is used to produce lower-threshold voltage PMOS devices having a specific threshold voltage from higher-threshold voltage PMOS devices that also have a specific threshold voltage. Through judicious choice of the background concentration, lower-threshold voltage NMOS devices having a specific threshold voltage are produced; and by judicious choice of the amount of dopant used for the threshold adjust, the adjustment of PMOS devices also provides the amount of implant needed to produce, from the lower-threshold voltage NMOS devices, higher-threshold voltage NMOS devices having a specific threshold voltage.

Figure 2:
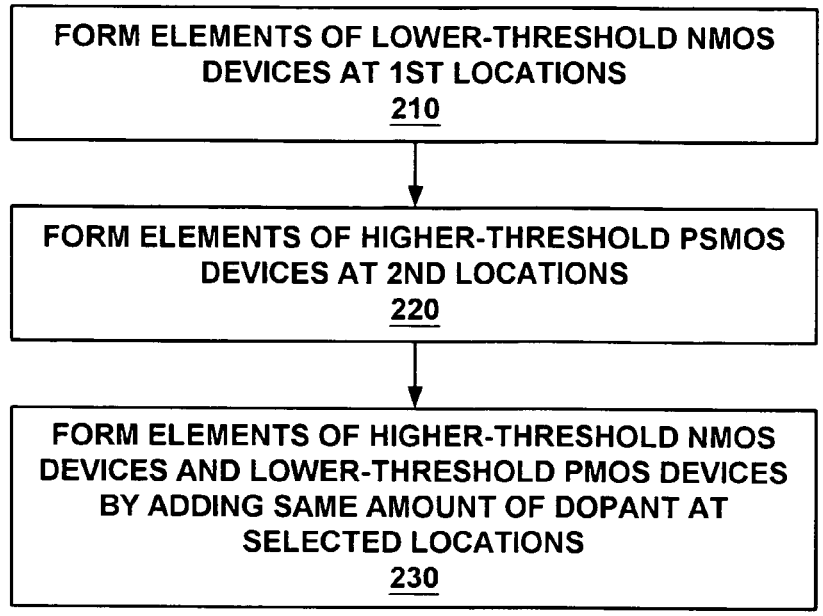
FIG. 2 is a flowchart of a process for fabricating NMOS and PMOS devices according to one embodiment of the present invention.
Figure 3:
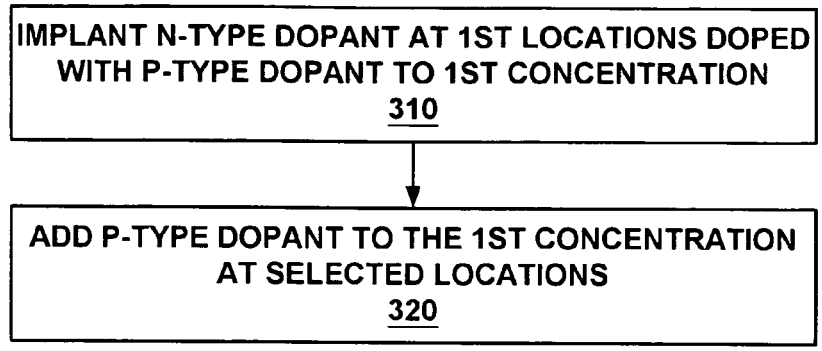
FIG. 3 is a flowchart of a process for fabricating NMOS devices according to one embodiment of the present invention.
Figure 4:
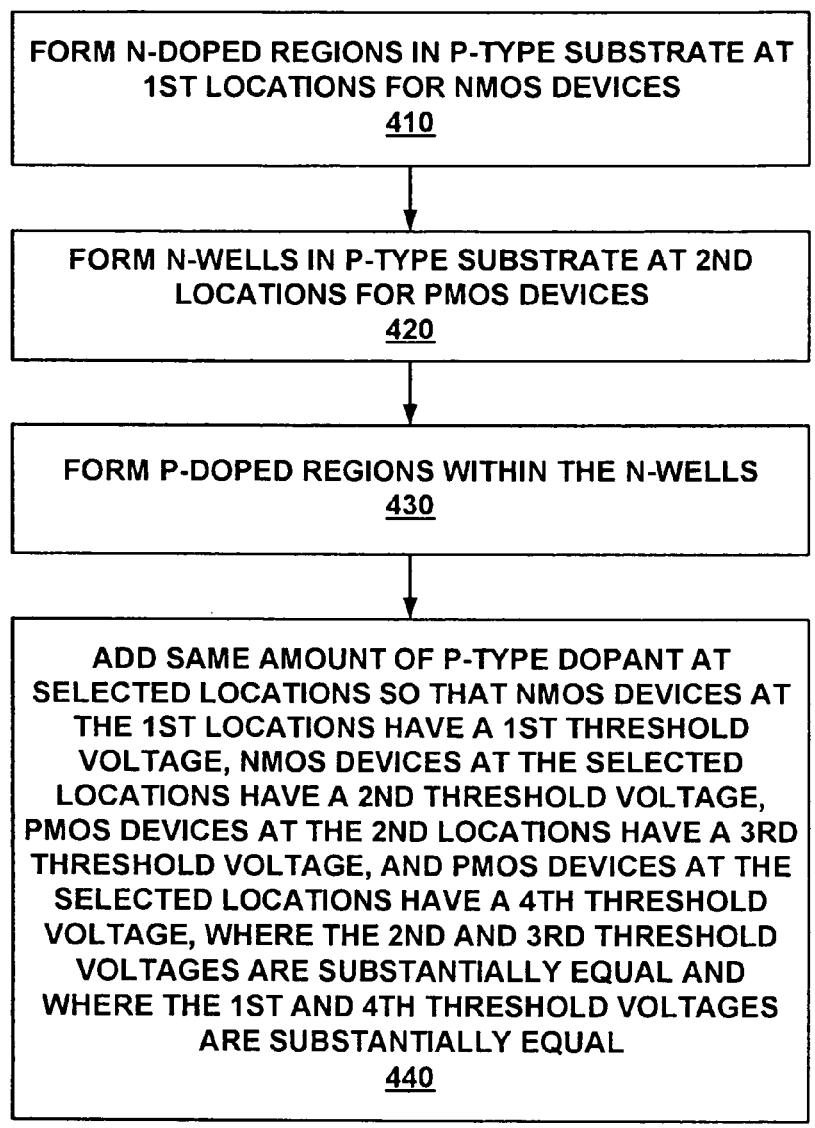
FIG. 4 is a flowchart of a process for fabricating NMOS and PMOS devices according to another embodiment of the present invention.

FIG. 2 is a flowchart 200 of a process for fabricating NMOS and PMOS devices according to one embodiment of the present invention. FIG. 3 is a flowchart 300 of a process for fabricating NMOS devices according to one embodiment of the present invention. FIG. 4 is a flowchart 400 of a process for fabricating NMOS and PMOS devices according to another embodiment of the present invention. Although specific steps are disclosed in flowcharts 200, 300 and 400, such steps are exemplary. That is, the present invention is well suited to performing various other steps or variations of the steps in flowcharts 200, 300 and 400. Also, some of the steps in the flowcharts 200, 300 and 400 may be performed in an order different than that shown or described.

Referring first to FIG. 2, flowchart 200 will be described with reference also to FIGS. 1A through 1D. Flowchart 200 pertains to a method of fabricating NMOS devices and PMOS devices having complementary threshold voltages. In step 210, in the present embodiment, elements of lower-threshold voltage NMOS devices, such as n-doped regions 104 and optional p-wells 102, are formed at first locations on a substrate 101. In step 220, in the present embodiment, elements of higher-threshold voltage PMOS devices, such as n-wells 106 and p-doped regions 108, are formed at second locations (different from the first locations) on a substrate 101. As described, the concentration of dopant (e.g., p-type dopant) at the first and second locations corresponds to a specific threshold voltage for the lower-threshold voltage NMOS devices as well as to a specific threshold voltage for the higher-threshold voltage PMOS devices.

In step 230, in the present embodiment, a same amount of dopant is added at locations selected from the first and second locations, in order to form elements of higher-threshold voltage NMOS devices and lower-threshold voltage PMOS devices at those locations. As described, the amount of dopant added is selected so that the resultant concentration of dopant at the selected locations corresponds to a specific threshold voltage for the higher-threshold voltage NMOS devices as well as a specific threshold voltage for the lower-threshold PMOS devices.

In one embodiment, the threshold voltages of the higher-threshold NMOS devices and the higher-threshold PMOS devices are substantially equal. In one such embodiment, the higher-threshold NMOS devices and higher-threshold PMOS devices have threshold voltages less than or equal to approximately 1 volt.

In another embodiment, the threshold voltages of the lower-threshold NMOS devices and the lower-threshold PMOS devices are substantially equal. In one such embodiment, the lower-threshold NMOS devices and the lower-threshold PMOS devices have threshold voltages in the range of approximately 0.4-0.5 volts.

Referring next to FIG. 3, flowchart 300 will be described with reference also to FIGS. 1A through 1D. Flowchart 300 pertains to a method of fabricating NMOS devices having different threshold voltages. In step 310, in the present embodiment, n-type dopant is implanted at first locations (e.g., n-doped regions 104) in a substrate 101 that has been doped with a p-type dopant to a first concentration. As described above, in one embodiment, this first concentration may correspond to the background concentration of a p-type substrate, while in another embodiment, this first concentration may correspond to a background concentration plus additional p-type dopant added to form optional p-wells 102. In either case, the first concentration corresponds to a first threshold voltage (e.g., for NMOS devices, a lower-threshold voltage).

In step 320, in the present embodiment, an amount of p-type dopant is added to the first concentration at selected locations to provide a second concentration. The amount of p-type dopant and implicitly the second concentration correspond to a second threshold voltage that is higher than the first threshold voltage.

Referring now to FIG. 4, flowchart 400 will be described with reference also to FIGS. 1A through 1D. Flowchart 400 pertains to a method of fabricating NMOS and PMOS devices having complementary threshold voltages. In step 410, in the present embodiment, n-doped regions (e.g., n-doped regions 104) are formed in a p-type substrate (e.g., substrate 101) at first locations where NMOS devices will be formed. Optionally, the n-doped regions are formed within p-wells 102. In step 420, in the present embodiment, n-wells (e.g., n-wells 106) are formed in the substrate 101 at second locations where PMOS devices will be formed. In step 430, in the present embodiment, p-doped regions (e.g., p-doped regions 108) are formed in the substrate 101 at the second locations. In step 440, in the present embodiment, a same amount of p-type dopant is added at locations selected from the first locations, and at locations selected from the second locations.

Embodiments of the present invention, processes providing high and low threshold p-type and n-type transistors, are thus described. While the present invention has been described in particular embodiments, it should be appreciated that the present invention should not be construed as limited by such embodiments, but rather construed according to the below claims.

What is claimed is:

1. A method of fabricating negative-channel metal-oxide semiconductor (NMOS) devices and positive-channel metal-oxide semiconductor (PMOS) devices having complementary threshold voltages, said method comprising:
   forming elements of lower-threshold voltage NMOS devices at first locations on a substrate;
   forming elements of higher-threshold voltage PMOS devices at second locations on said substrate; and
   forming elements of higher-threshold voltage NMOS devices and elements of lower-threshold PMOS devices by adding a same amount of p-type dopant at selected locations chosen from said first and second locations.

2. The method of claim 1 wherein threshold voltages of said higher-threshold NMOS devices and said higher-threshold PMOS devices are substantially equal.

3. The method of claim 1 wherein threshold voltages of said lower-threshold NMOS devices and said lower-threshold PMOS devices are substantially equal.

4. The method of claim 1 wherein said higher-threshold NMOS devices and higher-threshold PMOS devices have threshold voltages less than or equal to approximately one volt.

5. The method of claim 1 wherein said lower-threshold NMOS devices and said lower-threshold PMOS devices have threshold voltages in the range of approximately 0.4-0.5 volts.

6. The method of claim 1 wherein said p-type dopant added to said selected locations comprises boron.

7. A method of fabricating negative-channel metal-oxide semiconductor (NMOS) devices having different threshold voltages, said method comprising:
   implanting n-type dopant at first locations in a substrate to form source and drain regions for said NMOS devices, wherein said first locations are doped with p-type dopant to a first concentration that corresponds specifically to a first threshold voltage; and
   adding an amount of p-type dopant to said first concentration at second locations selected from said first locations, wherein addition of said amount to said first concentration provides a second concentration that corresponds specifically to a second threshold voltage that is higher than said first threshold voltage;
   wherein NMOS devices formed at said first locations corresponding to said first concentration have said first threshold voltage while NMOS devices formed at said second locations corresponding to said second concentration have said second threshold voltage.

8. The method of claim 7 comprising:
   receiving said substrate, wherein said substrate comprises a p-type substrate doped with p-type dopant to said first concentration.

9. The method of claim 7 comprising:
   receiving said substrate, wherein said substrate comprises a p-type substrate doped with p-type dopant at a concentration less than said first concentration; and
   adding p-type dopant at said first locations to get said first concentration at said first locations.

10. The method of claim 7 wherein said p-type dopant added to said first concentration comprises boron.

11. The method of claim 7 wherein said first threshold voltage is in the range of approximately 0.4-0.5 volts.

12. The method of claim 7 wherein said second threshold voltage is less than or equal to approximately one volt.

* * * * *